(12) United States Patent
Aube et al.

(10) Patent No.: US 8,883,654 B2
(45) Date of Patent: Nov. 11, 2014

(54) METHOD OF TREATING AN OXIDIZED LAYER OF METAL NITRIDE

(75) Inventors: Michel Aube, Ponthierry (FR); Pierre De Person, Corbeil Essonnes (FR)

(73) Assignee: Altis Semiconductor, Corbeil Essonnes (FR)

( * ) Notice: Subject to any disclaimer, the term of this patent is extended or adjusted under 35 U.S.C. 154(b) by 138 days.

(21) Appl. No.: 13/408,172

(22) Filed: Feb. 29, 2012

(65) Prior Publication Data

US 2012/0228642 A1 Sep. 13, 2012

(30) Foreign Application Priority Data

Mar. 7, 2011 (FR) ...................... 11 51850

(51) Int. Cl.
| | | |
|---|---|---|
| H01L 21/31 | (2006.01) | |
| H01L 21/321 | (2006.01) | |
| C23C 14/58 | (2006.01) | |
| C23C 14/06 | (2006.01) | |
| H01L 33/40 | (2010.01) | |
| H01L 29/45 | (2006.01) | |
| H01L 21/768 | (2006.01) | |

(52) U.S. Cl.
CPC .............. *H01L 21/321* (2013.01); *H01L 33/40* (2013.01); *C23C 14/5853* (2013.01); *H01L 2933/0016* (2013.01); *H01L 29/452* (2013.01); *H01L 29/456* (2013.01); *H01L 21/7685* (2013.01); *C23C 14/0641* (2013.01); *C23C 14/5826* (2013.01); *H01L 21/76861* (2013.01); *Y10S 257/915* (2013.01)
USPC ........... 438/785; 438/431; 438/584; 438/597; 438/645; 257/98; 257/383; 257/915; 257/E21.282; 257/E23.163

(58) Field of Classification Search
USPC ........... 438/431, 597, 645, 758, 785; 257/98, 257/383, 915, E21.282, E23.163
See application file for complete search history.

(56) References Cited

U.S. PATENT DOCUMENTS

| | | | |
|---|---|---|---|
| 5,970,378 | A | 10/1999 | Shue et al. |
| 6,169,027 | B1 | 1/2001 | Dobson |
| 6,211,072 | B1 | 4/2001 | Brennan |
| 6,743,473 | B1 | 6/2004 | Parkhe et al. |
| 2003/0155575 | A1 | 8/2003 | Shibata et al. |
| 2006/0258172 | A1* | 11/2006 | Russell et al. ................ 438/778 |
| 2007/0141806 | A1 | 6/2007 | Uemura et al. |
| 2011/0146794 | A1* | 6/2011 | Tsai .............................. 136/259 |

FOREIGN PATENT DOCUMENTS

| | | |
|---|---|---|
| EP | 0776991 | 6/1997 |
| EP | 1001454 | 5/2000 |
| JP | 11330546 | 11/1999 |

OTHER PUBLICATIONS

International Search Report Dated Oct. 17, 2011.

* cited by examiner

*Primary Examiner* — Su Kim
(74) *Attorney, Agent, or Firm* — Sofer & Haroun, LLP

(57) ABSTRACT

The present arrangement provides a method of treating an oxidized layer of metal nitride, including oxidizing a layer (2) of metal oxide at the surface of a first layer (1) of nitride of said metal using a plasma of an oxidizing species with an oxidation number that is greater than that of oxygen in order to form a metallic layer (3) of a compound based on said metal; and reducing the metallic layer (3) formed in step i) using a plasma of hydrogen and nitrogen to form a second layer (4) of nitride of said metal.

16 Claims, 1 Drawing Sheet

METHOD OF TREATING AN OXIDIZED LAYER OF METAL NITRIDE

RELATED APPLICATION

This application claims the benefit of priority from French Patent Application No. 11 51850, filed on Mar. 7, 2011, the entirety of which is incorporated by reference.

BACKGROUND

1. Field of the Invention

The present invention relates to a method of treating an oxidized layer of metal nitride.

2. Description of Related Art

It is typically but not exclusively applicable to the fabrication of metal electrodes used in particular in the fabrication of light-emitting diodes (LEDs).

The document. U.S. Pat. No. 6,169,027 discloses a treatment method consisting in eliminating the presence of a layer of titanium oxide formed at the surface of a layer of titanium nitride, by applying a high temperature plasma of hydrogen and nitrogen. Hence, the titanium oxide is reduced by the hydrogen to form titanium nitride.

However, the disadvantage with that type of method is that is has to be carried out at high temperatures, i.e. at a temperature in the range 400° C. to 550° C.

A temperature that high, as required for direct reduction of the titanium nitride, means that the prior art method cannot be carried out on an assembly of elements comprising both the layer of titanium nitride and also other layers and/or components (e.g. transistors, resistors, etc.) having physico-chemical properties that are degraded at high temperatures, in particular at temperatures above 400° C.

OBJECTS AND SUMMARY

The present invention aims to overcome the disadvantages of prior art techniques, in particular by proposing a low-temperature method of treating an oxidized layer of metal nitride, which method enables the entire layer of the oxide of said metal that is formed at the surface of the layer of metal nitride to be removed at least in part or even in full, while guaranteeing a substantially uniform surface for the layer of metal nitride once the layer of the oxide of said metal has been removed.

The present invention provides a method of treating an oxidized layer of metal nitride, comprising the steps consisting in:

i) oxidizing a layer of metal oxide at the surface of a first layer of nitride of said metal using a plasma of an oxidizing species with an oxidation number that is greater than that of oxygen to form a metallic layer of a compound based on said metal; and ii) reducing the metallic layer formed in step i) using a plasma of hydrogen and nitrogen to form a second layer of nitride of said metal.

By means of the present invention, said layer of metal oxide is eliminated by being chemically replaced (cf. oxidation) by said metallic layer in step i), said metallic layer then being chemically transformed (cf. reduction) in step ii) into a layer of nitride of said metal, the treatment method of the invention being carried out at low temperature.

The fact that said layer of metal oxide can be eliminated also means that all of the contaminants or pollutants likely to be found on the surface of said layer of metal oxide are removed, in particular the contaminants that may have originated from prior etching steps, such as polymers comprising carbon, oxygen, fluorine atoms, etc., for example.

Further, once removed, the layer of metal oxide can advantageously be used to obtain a second layer of metal nitride with substantially uniform thickness at the surface of the first layer of metal nitride.

This uniformity of thickness, or in other words this flatness, is highly advantageous, in particular when using the thus-treated layer of metal nitride during fabrication of LEDs. This flatness can in fact guarantee good electrical resistivity properties, which in particular result in a uniformly emitted light signal in the field of LEDs.

In the present invention, at least one layer of metal nitride is covered with the layer of oxide of said metal (i.e. oxidized layer of metal nitride) no form a stack of layers. Said stack of layers formed by the first and the second layers of metal nitride remain stable to ambient atmosphere.

The stack of layers such as the oxidized layer of metal nitride may form part of an assembly of elements comprising a wafer of a semiconductor substrate that is the initial layer onto which the set of constituent layers of the assembly is deposited. Other layers and/or components may be present between the wafer of said substrate and the oxidized layer of metal nitride.

The layers of the invention are preferably thin layers of circular cross-section. The thickness of said layers may be from a few angstroms (Å) to several thousand Å.

Complete elimination of the layer of metal oxide formed at the surface of the first layer of metal nitride may be achieved by consuming a portion of the first layer of metal nitride during step ii). Clearly, the skilled person could adjust the operating conditions of step ii) to minimize said consumption.

The layer of metal oxide is routinely formed following certain stripping methods requiring a plasma based on oxygen. An example that may be mentioned is to use an oxygen ($O_2$) plasma to strip a resin mask that has been deposited on the first layer of metal nitride during fabrication of a metal electrode.

The term "metal electrode" means a stack of a plurality of electrically conductive layers comprising at least one electrically conductive layer, such as a layer of aluminum, for example, or copper, or a layer of a mixture of aluminum and copper, onto which the first layer of metal nitride has been deposited.

As a consequence, the formation of a layer of metal oxide at the surface of the first layer of metal nitride is deleterious to the electrode since this layer of metal oxide acts as an electrical barrier because of its electrical resistivity compared with said layer of metal nitride.

Under such circumstances, the first layer of metal nitride deposited on the electrically conductive layer may be defined as an "encapsulation" layer, which is electrically conductive, protecting the electrically conductive layer from physico-chemical interactions that might occur during steps subsequent to depositing the electrically conductive layer.

The treatment method of the invention has the advantage of being able to be carried out at low temperature in order to avoid any degradation of the constituent components (e.g. transistors, resistors, etc.) of an assembly of elements comprising the oxidized layer of titanium nitride to be treated, said components possibly having physico-chemical properties that are degraded at temperatures above said "low temperature". In other words, the temperatures of steps i) and ii) in particular are below the temperatures at which the physico-chemical properties of said components become degraded.

More particularly, said method may be carried out at temperatures that are strictly less than 400° C., or even at much lower temperatures. Thus, steps i) and ii) of the treatment method of the invention may be carried out at temperatures strictly less than 400° C.

In a first, particularly advantageous implementation, step i) is carried out at a temperature of at most 300° C., preferably at most 200° C., and more preferably at most 100° C.

In a second, particularly advantageous implementation, step ii) is carried out at a temperature of at most 300° C., preferably at most 200° C., and more preferably at most 100° C.

In a third implementation, the first and the second implementations are combined.

Steps i) and ii) of the invention are preferably carried out in a plasma reactor including a chuck. The temperatures mentioned in the present invention are those measured in the plasma reactor in which steps i) and ii) are carried out; more particularly, said temperatures are those of the chuck on which the stack to be treated comprising the first oxidized layer of metal nitride is positioned.

Further, steps i) and ii) are preferably carried out in an inert atmosphere, or in other words in an oxygen-free atmosphere. As an example, they may be carried out in a nitrogen atmosphere or under vacuum.

The constituent metal of the layer of metal nitride, the layer of metal oxide and she metallic layer is the same metal.

Preferably, said metal belongs to the transition metal family and may advantageously be selected from tantalum, titanium, and tungsten, or a mixture thereof.

The oxidizing species of the invention may be a plasma based on fluorine (i.e. a plasma including fluorine). Nitrogen trifluoride ($NF_3$) may be mentioned in particular.

When the plasma is based on fluorine, the metallic layer is a layer composed of metal fluoride.

When she metal under consideration is tantalum or titanium, said metal fluoride is then tantalum fluoride or titanium fluoride.

In step ii), the plasma of hydrogen and nitrogen may be selected from a plasma of a mixture of hydrogen and nitrogen and a plasma of $NH_3$, or a mixture thereof.

In the present invention the electron density, the energy of bombardment and the duration of the plasma treatments in steps i) and ii) are parameters that are well known to the skilled person for optimizing the chemical transformation of the layer of metal oxide to a metallic layer (step i)), and the chemical transformation of the metallic layer into a layer of metal nitride (step ii)).

These parameters are adjusted in order to be able to form a plasma that is stable for a time that is sufficient to allow the layer of metal oxide to be replaced by the metallic layer in step i) and to allow said metallic layer to be transformed into a layer of nitride of said metal in step ii).

By way of example, for steps i) and ii), an electron density of approximately $1.2 \times 10^{10}$ $cm^{-3}$ [per cubic centimeter], a bombardment energy in the range 120 eV [electron volt] to 210 eV, and a duration of the order of 15 s [second] to 20 s may be mentioned.

In a further aspect, the invention provides a stack of layers comprising said first layer of metal nitride covered with said second layer of nitride of said metal, said layers being obtained by the treatment method of the present invention.

This stack of two layers of nitride of the same metal has the advantage of guaranteeing good electrical resistivity properties, which primarily result in a uniformly emitted light signal in the field of LEDs.

In a further aspect, the invention provides a metal electrode comprising said first layer of metal nitride covered with said second layer of nitride of said metal, said layers being obtained by the treatment method of the present invention.

Said metal electrode may be an anode, in particular used in the fabrication of LEDs, said anode allowing light to be transmitted to the color filters employed in this type of technology.

In a further aspect, the invention provides a light-emitting diode comprising said first layer of metal nitride covered with said second layer of nitride of said metal, said layers being obtained by the treatment method of the present invention.

BRIEF DESCRIPTION OF THE DRAWINGS

Further characteristics and advantages of the present invention become apparent from the following example invention described with reference to the accompanying annotated figures; the example and the figures are given by way of non-limiting illustration.

DETAILED DESCRIPTION

Figure 1:
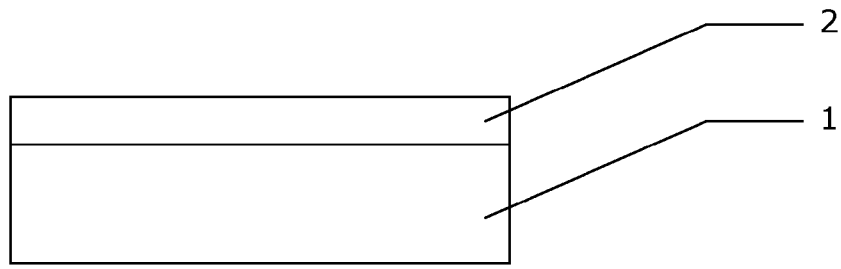
FIG. 1 is a side view of a stack of two layers before applying the treatment method of the invention.

For clarity, the same elements have been given identical reference numerals. Further, only those elements that are essential to understanding the invention are shown, and they are shown in diagrammatic manner and not to scale.

FIG. 1 shows a stack of at least two layers having a circular cross-section with a diameter of 200 mm [millimeter] before applying the treatment method of the present invention. These two layers were a first layer of titanium nitride (1) with a thickness of 80 Å, the upper portion of which was covered with a layer of titanium oxide (2) with a thickness of approximately 40 Å. The total thickness of these two layers was thus 120 Å.

Said stack was deposited on the chuck of a plasma reactor supplied by Tokyo Electron Limited, with the reference 85 SCCM. Clearly, the first layer of nitride was not in direct physical contact with the chuck. Said stack was originally deposited on a wafer of a substrate of semiconductor material (not shown in FIGS. 1 to 3) such as silicon. Thus, said stack was deposited on the chuck by means of said substrate.

Initially, and in said reactor and in a nitrogen atmosphere, the layer of titanium oxide (2) was oxidized with a plasma or nitrogen trifluoride ($NF_3$) to form titanium fluoride and nitric oxide.

The oxidation reaction conditions were as follows:
electron density of plasma: $1.2 \times 10^{10}$ $cm^{-3}$;
bombardment energy of plasma: 200 eV;
temperature of chuck: 50° C.; and
duration of oxidation step: 15 s.

Figure 2:
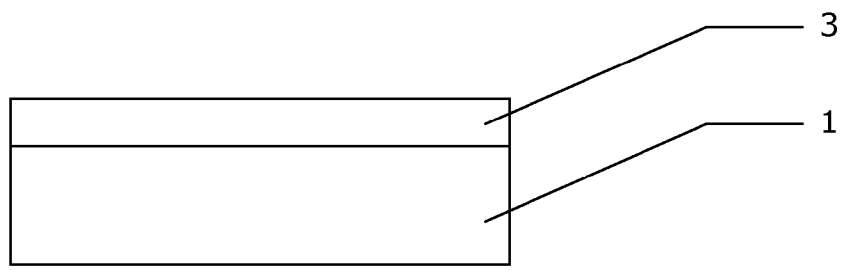
FIG. 2 shows the stack of FIG. 1 once step i) of the invention has been carried out

Once the oxidation step had been carried out, the stack of FIG. 2 was obtained, still comprising the first layer of titanium nitride (1) but no longer covered with the layer of titanium oxide (2) but with a metallic layer of titanium fluoride (3) or circular cross-section.

Secondly and in the same reactor, still in a nitrogen atmosphere, the layer of titanium fluoride (3) was reduced by a plasma comprising a mixture of hydrogen ($H_2$) and nitrogen ($N_2$), to form titanium nitride and hydrofluoric acid.

The reduction reaction conditions were as follows:
electron density of plasma: $1.2 \times 10^{10}$ cm$^{-3}$;
bombardment energy of plasma: 140 eV;
temperature of chuck: 50° C.; and
duration of oxidation step: 20 s.

Figure 3:
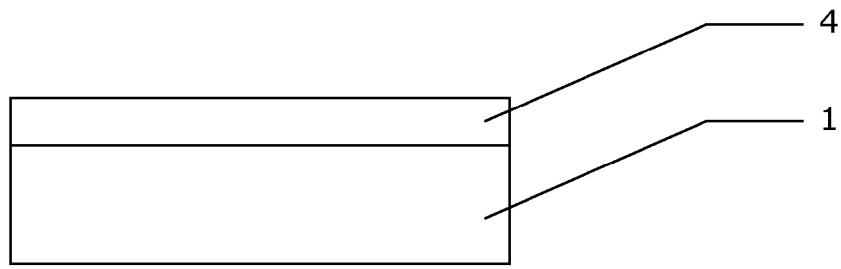
FIG. 3 shows the stack of FIG. 2 once step ii) of the invention has been carried out.

Once the reduction step had been carried out, the stack of FIG. 3 was obtained, still comprising the first layer of titanium nitride (1) but no longer covered with the layer of titanium fluoride (3), but with a second layer of titanium nitride (4) with a circular cross-section.

Clearly, the reduction step has consumed a little titanium nitride from the first titanium nitride layer; the total thickness of the stack formed by the first and the second layers of titanium nitride after step ii) was 67 Å.

However, said consumption of titanium nitride following the reduction step could readily be minimized by the skilled person by adjusting the operating conditions for reduction (radiofrequency (RF) power density of plasma and/or temperature of chuck and/or duration of reduction step).

The thicknesses of the layers in the context of the present invention were measured using X ray fluorescence, employing an apparatus from Panalytical.

In order to verify the uniformity of the second layer of titanium nitride, the variation in thickness over the whole surface of said layer was also measured by X-ray fluorescence using the apparatus mentioned above.

These measurements were carried out at five different points of the second layer of titanium nitride: one measurement at the center and our measurements at the periphery, 4 cm [centimeter] from the outer border of said layer, at 90° [degrees] to one another.

The variation between the smallest measured thickness and the largest measured thickness over the total thickness of the stack formed by the first and second layers of titanium nitride was only 14 Å, or in other words the total thickness was 67 Å plus or minus 7 Å, as measured.

Further, the stacks shown in FIGS. 1 to 3 are not limited to these two layers. When fabricating a metal electrode, the first layer of metal nitride is typically deposited onto an electrically conductive layer such as a layer of aluminum and/or copper (not shown in FIGS. 1 to 3).

The invention claimed is:

1. A method of treating an oxidized layer of metal nitride, comprising the steps of:
   i) oxidizing a layer of metal oxide at the surface of a first layer of nitride of said metal using a plasma of an oxidizing species with an oxidation number that is greater than that of oxygen in order to form a metallic layer of a compound based on said metal; and
   ii) reducing the metallic layer formed in step i) using a plasma of hydrogen and nitrogen to form a second layer of nitride of said metal.

2. The method according to claim 1, wherein step i) is carried out at a temperature of at most 300° C.

3. The method according to claim 1, wherein step ii) is carried out at a temperature of at most 300° C.

4. The method according to claim 1, wherein the metal of the layer of metal nitride, of the layer of metal oxide and of the metallic layer is a metal belonging to the transition metal family.

5. The method according to claim 4, wherein said metal is selected from the group consisting of tantalum, titanium, and tungsten, and a mixture thereof.

6. The method according to claim 1, wherein the oxidizing species is nitrogen trifluoride (NF$_3$).

7. The method according to claim 1, wherein the metallic layer is a layer composed of metal fluoride.

8. The method according to claim 7, wherein the metal fluoride is tantalum fluoride or titanium fluoride.

9. The method according to claim 1, wherein the plasma of hydrogen and nitrogen is selected from a mixture of hydrogen and nitrogen and a. NH$_3$ plasma or a mixture thereof.

10. A light-emitting diode comprising said first layer of metal nitride covered with said second layer of nitride of said metal, said layers being obtained by the treatment method as defined in claim 1.

11. The method according to claim 2, wherein step i) is carried out at a temperature of at most 200° C.

12. The method according to claim 2, wherein step i) is carried out at a temperature of at most 100° C.

13. The method according to claim 3, wherein step ii) is carried out at a temperature of at most 200° C.

14. The method according to claim 3, wherein step ii) is carried out at a temperature of at most 100° C.

15. A method of treating an oxidized layer of metal nitride, comprising the steps of:
   i) oxidizing a layer of metal oxide at the surface of a first layer of nitride of said metal using a plasma of an oxidizing species with an oxidation number that is greater than that of oxygen in order to form a metallic layer of a compound based on said metal, the oxidizing species being a plasma based on fluorine; and
   ii) reducing the metallic layer formed in step i) using a plasma of hydrogen and nitrogen to form a second layer of nitride of said metal.

16. A method of treating an oxidized layer of metal nitride, comprising the steps of:
   i) oxidizing a layer of metal oxide at the surface of a first layer of nitride of said metal using a plasma of an oxidizing species with an oxidation number that is greater than that of oxygen in order to form a metallic layer of a compound based on said metal, the oxidizing species being a plasma based on a material different from oxygen; and
   ii) reducing the metallic layer formed in step i) using a plasma of hydrogen and nitrogen to form a second layer of nitride of said metal.

* * * * *